United States Patent
Inoue

(10) Patent No.: US 10,615,103 B2
(45) Date of Patent: Apr. 7, 2020

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Kazuhiro Inoue, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/027,442

(22) Filed: Jul. 5, 2018

(65) Prior Publication Data

US 2019/0295933 A1    Sep. 26, 2019

(30) Foreign Application Priority Data

Mar. 23, 2018 (JP) .................... 2018-056246

(51) Int. Cl.
*H01L 21/00* (2006.01)
*H01L 23/495* (2006.01)
*H01L 23/31* (2006.01)

(52) U.S. Cl.
CPC .... *H01L 23/49541* (2013.01); *H01L 23/3114* (2013.01)

(58) Field of Classification Search
None
See application file for complete search history.

(56) References Cited

U.S. PATENT DOCUMENTS

| 7,608,917 | B2 | 10/2009 | Kajiwara et al. | |
| 9,620,440 | B1* | 4/2017 | Shibuya | ............ H01L 23/49568 |
| 2006/0043618 | A1* | 3/2006 | Ashida | .................. H01L 21/566 257/427 |

FOREIGN PATENT DOCUMENTS

| JP | 4967447 B2 | 7/2012 |
| JP | 5456113 B2 | 1/2014 |
| JP | 2015-225918 A | 12/2015 |

* cited by examiner

*Primary Examiner* — Reema Patel
(74) *Attorney, Agent, or Firm* — White & Case LLP

(57) ABSTRACT

Provided is a semiconductor device according to an embodiment including a first electrode terminal containing copper, a second electrode terminal containing copper, a semiconductor chip provide the first electrode terminal and provided inside the first electrode terminal, a metal member provided on the semiconductor chip, protruding to an outside of the semiconductor chip in at least two directions, electrically connected to the second electrode terminal, and containing copper, and a mold resin surrounding the semiconductor chip.

9 Claims, 4 Drawing Sheets

SEMICONDUCTOR DEVICE

This application is based upon and claims the benefit of priority from Japanese Patent Application No. 2018-056246, filed on Mar. 23, 2018, the entire contents of which are incorporated herein by reference.

FIELD

Embodiments described herein relate generally to a semiconductor device.

BACKGROUND

In a semiconductor package, components having different thermal expansion coefficients such as metal leads, semiconductor chips, mold resins, and metal heat dissipation members are mixed. Therefore, for example, in a thermal process such as a solder reflow process, there is a concern that cracks or the like in the semiconductor package may occur due to stress generated in the semiconductor package.

The occurrence of cracks and the like in the semiconductor package causes initial defects and poor reliability of the semiconductor package. For this reason, it is required to reduce the stress generated in the semiconductor package.

DETAILED DESCRIPTION

Figure 1A:
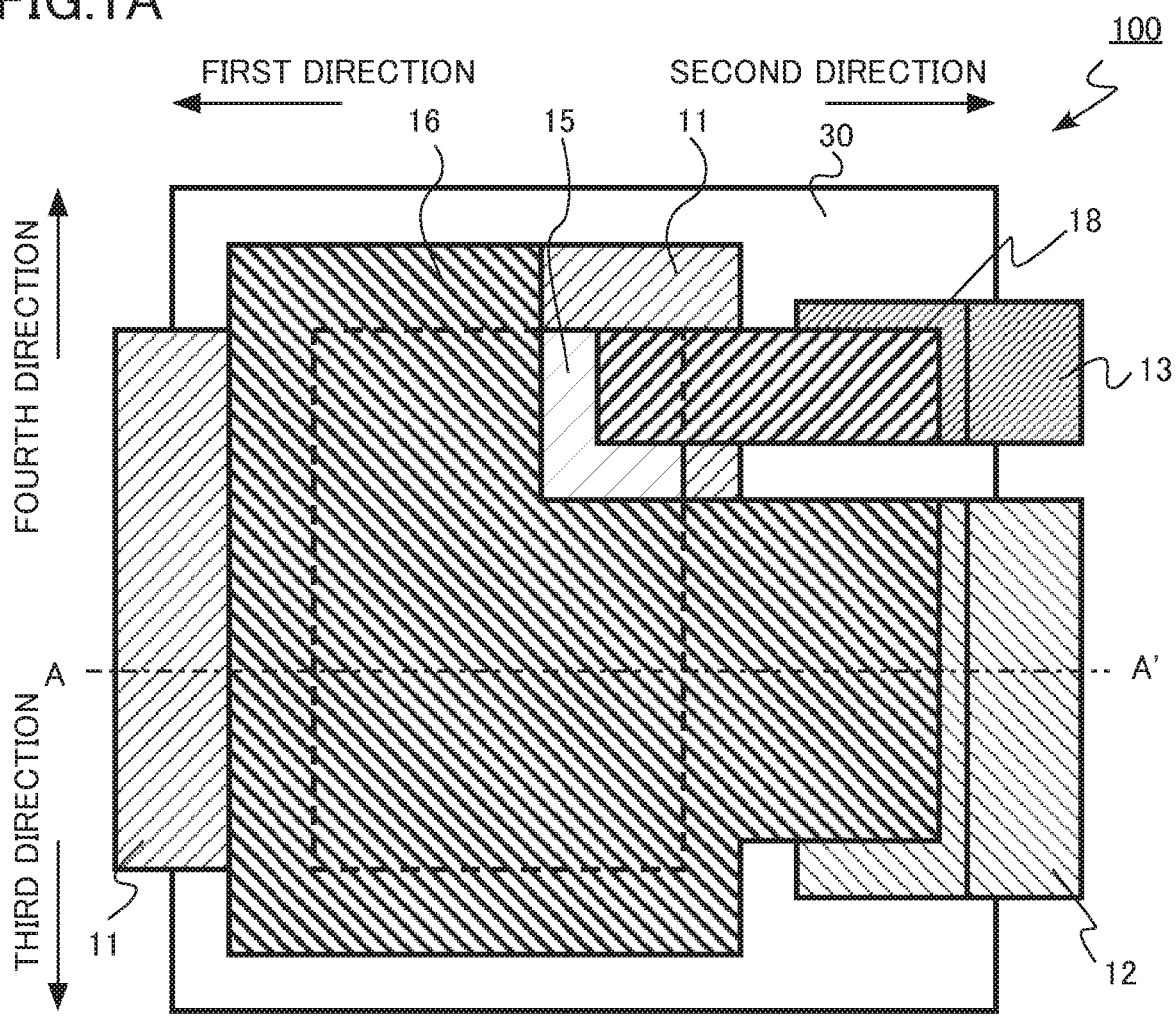
FIGS. 1A and 1B are schematic diagrams of a semiconductor device according to a first embodiment.

In this specification, the same or similar members are denoted by the same reference numerals, and in some cases, redundant description thereof may be omitted.

In this specification, in order to indicate a positional relationship of components or the like, the upward direction of the drawing may be described as "upper," and the downward direction of the drawing may be described as "lower". In this specification, the concepts of "upper" and "lower" are not necessarily terms indicating the relationship with the direction of gravity.

First Embodiment

A semiconductor device according to a first embodiment includes a first electrode terminal containing copper, a second electrode terminal containing copper, a semiconductor chip which is provided on the first electrode terminal and does not protrude from an outer periphery of the first electrode terminal as viewed from above, a metal member which is provided on the semiconductor chip, protrudes to an outside of the semiconductor chip in at least two directions parallel to the front surface of the first electrode terminal, is electrically connected to the second electrode terminal and contains copper, and a mold resin which surrounds the semiconductor chip.

The semiconductor device according to the first embodiment is a semiconductor package 100 in which a semiconductor chip after a lead forming process is sealed with a mold resin.

Figure 1B:
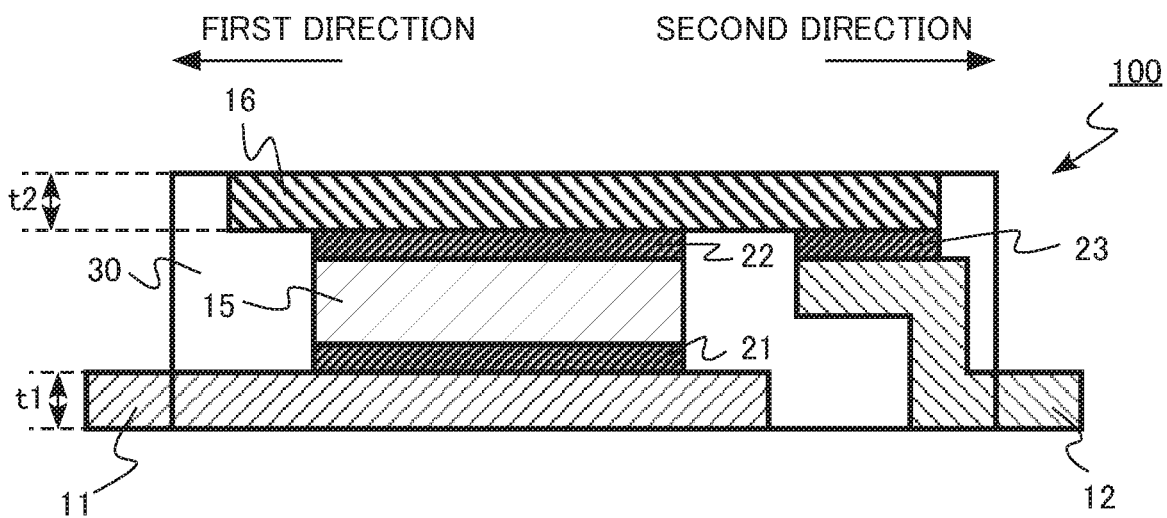

FIGS. 1A and 1B are schematic diagrams of a semiconductor device according to a first embodiment. FIG. 1A is a top diagram of the semiconductor package 100. FIG. 1A is a perspective diagram of the mold resin. FIG. 1B is a cross-sectional diagram of the semiconductor package 100. FIG. 1B is a cross-sectional diagram taken along line A-A' of FIG. 1A.

The semiconductor package 100 includes a drain lead 11 (first electrode terminal), a source lead 12 (second electrode terminal), a gate lead 13, a semiconductor chip 15, a first metal member 16 (metal member), a second metal member 18, a first bonding layer 21, a second bonding layer 22, a third bonding layer 23, and a mold resin 30.

The drain lead 11 is a plate-shaped metal. The drain lead 11 contains, for example, copper. The drain lead 11 is, for example, a pure copper or a copper alloy. The drain lead 11 is an example of the first electrode terminal. The lower surface of the drain lead 11 is exposed, for example, to the lower surface of the mold resin.

The source lead 12 is a metal. The source lead 12 contains, for example, copper. The source lead 12 is, for example, a pure copper or a copper alloy. The source lead 12 is an example of the second electrode terminal.

The gate lead 13 is a metal. The gate lead 13 contains, for example, copper. The gate lead 13 is, for example, a pure copper or a copper alloy.

The semiconductor chip 15 is provided on the drain lead 11. The semiconductor chip 15 does not protrude from the outer periphery of the drain lead 11 as viewed from above. The semiconductor chip 15 is provided inside the drain lead 11. The end portion of the semiconductor chip 15 is located on the drain lead 11. In FIG. 1A, the dotted line represents the position of the end portion of the semiconductor chip 15.

The first bonding layer 21 is provided between the drain lead 11 and the semiconductor chip 15. The drain lead 11 and the semiconductor chip 15 are bonded by the first bonding layer 21. The first bonding layer 21 is, for example, solder.

The semiconductor chip 15 is, for example, a vertical metal oxide field effect transistor (MOSFET). The semiconductor chip 15 has, for example, a source electrode and a gate electrode (not illustrated) on the upper surface thereof. In addition, the semiconductor chip 15 has, for example, a drain electrode (not illustrated) on the lower surface thereof.

The drain lead 11 and the drain electrode are electrically connected to each other by the first bonding layer 21.

The first metal member 16 is provided on the semiconductor chip 15. The first metal member 16 protrudes to the outside of the semiconductor chip 15 in at least two directions parallel to the front surface of the drain lead 11. The end portion of the first metal member 16 is outside the semiconductor chip 15 in at least two directions. For example, in FIG. 1A, the first metal member 16 protrudes to the outside of the semiconductor chip 15 in four directions of a first direction, a second direction, a third direction, and a fourth direction.

The first metal member 16 is a plate-shaped metal. The first metal member 16 contains, for example, copper. The first metal member 16 is, for example, a pure copper or a copper alloy. The first metal member 16 is an example of the metal member.

A thickness (t1 in FIG. 1B) of the first metal member 16 is equal to a thickness (t1 in FIG. 1B) of the drain lead 11. The thickness t2 of the first metal member 16 and the thickness t1 of the drain lead 11 are substantially the same within the respective tolerance ranges. The tolerance of the thickness t2 of the first metal member 16 is, for example, ±10% of the thickness. The tolerance of the thickness t1 of the drain lead 11 is, for example, ±10% of the thickness.

A second bonding layer 22 is provided between the semiconductor chip 15 and the first metal member 16. The semiconductor chip 15 and the first metal member 16 are bonded to each other by the second bonding layer 22. The second bonding layer 22 is, for example, a solder.

The source electrode and the first metal member 16 are electrically connected to each other by the second bonding layer 22.

The first metal member 16 is provided on the source lead 12. A third bonding layer 23 is provided between the first metal member 16 and the source lead 12. The source lead 12 and the first metal member 16 are bonded to each other by the third bonding layer 23. The third bonding layer 23 is, for example, solder.

The first metal member 16 and the source lead 12 are electrically connected to each other by the third bonding layer 23. The source electrode is electrically connected to the source lead 12 through the second bonding layer 22, the first metal member 16, and the third bonding layer 23.

The front surface of the first metal member 16 is exposed, for example, to the front surface of the mold resin 30. The front surface of the first metal member 16 is exposed, for example, to the upper surface of the mold resin 30. In this case, the first metal member 16 functions as a heat dissipation plate of the semiconductor package.

The second metal member 18 is provided on the semiconductor chip 15. The second metal member 18 is a plate-shaped metal. The second metal member 18 contains, for example, copper. The second metal member 18 is, for example, a pure copper or a copper alloy.

A fourth bonding layer (not, illustrated) is provided between the semiconductor chip 15 and the second metal member 18. The semiconductor chip 15 and the second metal member 18 are bonded to each other by the fourth bonding layer. The fourth bonding layer is, for example, solder.

The gate electrode and the second metal member 18 are electrically connected to each other by the fourth bonding layer.

The second metal member 18 is provided on the gate lead 13. A fifth bonding layer (not illustrated) is provided between the second metal member 18 and the gate lead 13. The gate lead 13 and the second metal member 18 are bonded to each other by the fifth bonding layer. The fifth bonding layer is, for example, solder.

The second metal member 18 and the to lead 13 are electrically connected to each other by the fifth bonding layer. The gate electrode is electrically connected to the gate lead 13 through the fourth bonding layer, the second metal member 18, and the fifth bonding layer.

The mold resin 30 surrounds the semiconductor chip 15. The mold resin 30 is, for example, an epoxy resin.

Next, function and effect of the semiconductor device according to the first embodiment will be described.

In the semiconductor package, components having different thermal expansion coefficients such as metal leads, semiconductor chips, mold resins, and metal heat dissipation members, are mixed. Therefore, for example, when a thermal process such as a solder reflow process is obtained, cracks or the like in the semiconductor package may occur due to stress generated in the semiconductor package.

The occurrence of cracks and the like in the semiconductor package causes initial defects and poor reliability of the semiconductor package. Therefore, it is required to reduce the stress generated in the semiconductor package.

Figure 2A:
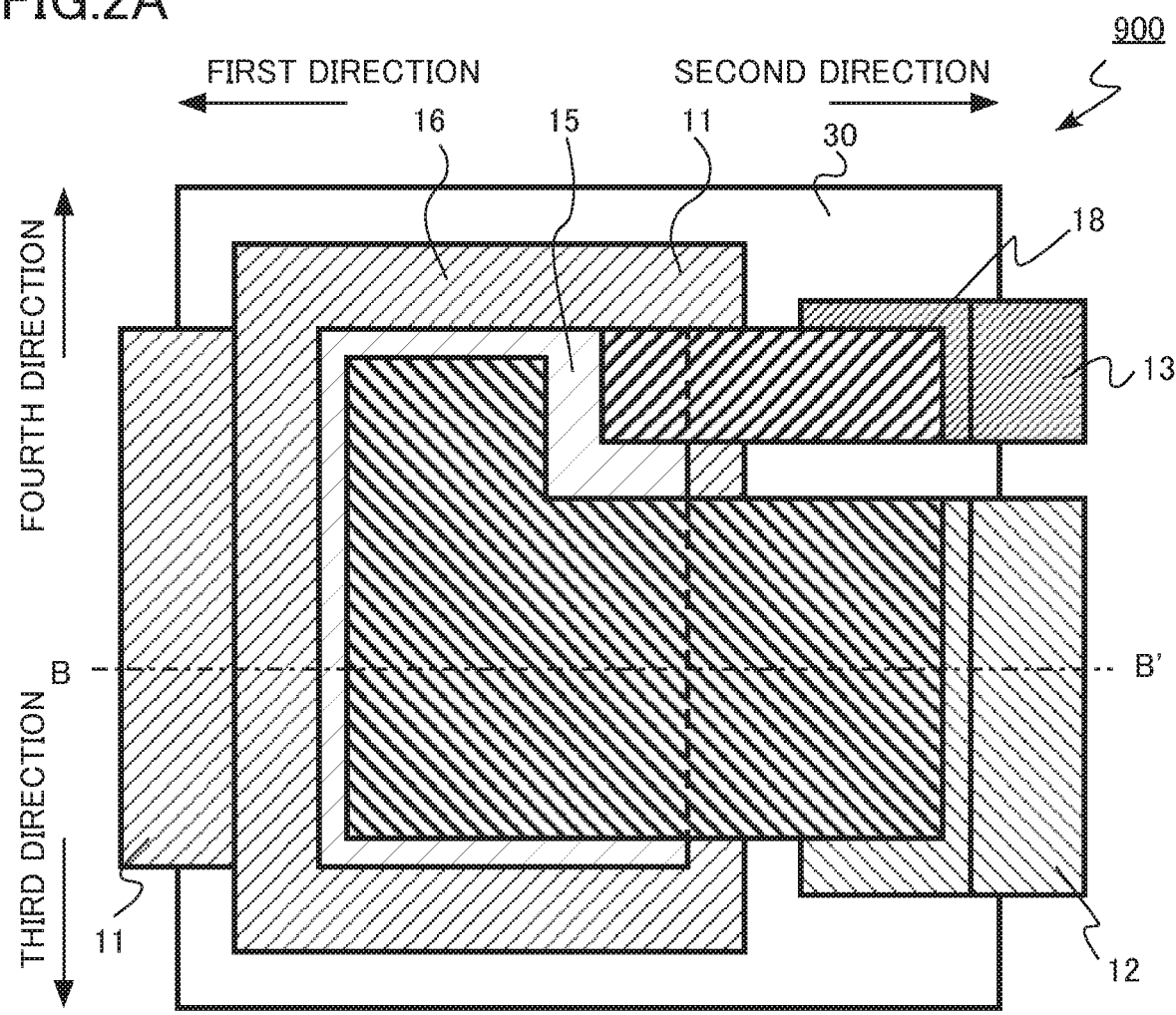
FIGS. 2A and 2B are schematic diagrams of a semiconductor device according to Comparative Example.
Figure 2B:
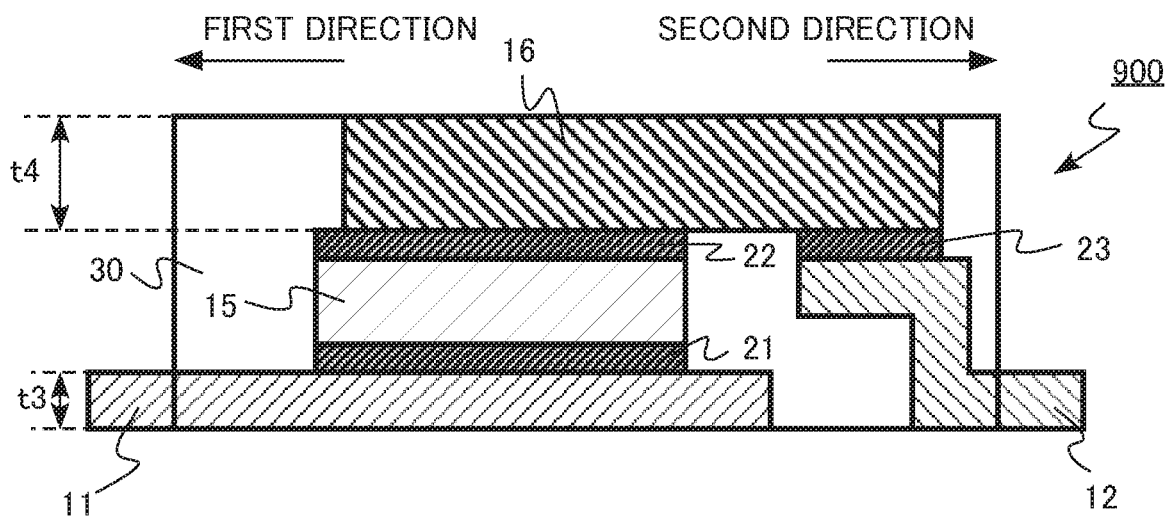

FIGS. 2A and 2B are schematic diagrams of a semiconductor device according to Comparative Example. FIG. 2A is a top diagram of a semiconductor package 900. FIG. 2A is a perspective diagram of a mold resin. FIG. 2B is a cross-sectional diagram of the semiconductor package 900. FIG. 2B is a cross-sectional diagram taken along line B-B' of FIG. 2A.

In the semiconductor package 900 according to Comparative Example, the shape and the thickness of the first metal member 16 are different from those of the semiconductor package 100 according to the first embodiment. Hereinafter, redundant description of the same contents as those of the semiconductor package 100 according to the first embodiment may be omitted.

The semiconductor package 900 includes a drain lead 11, a source lead 12, a gate lead 13, a semiconductor chip 15, a first metal member 16, a second metal member 18, a first bonding layer 21, a second bonding layer 22, a third bonding layer 23, and a mold resin 30.

The first metal member 16 of the semiconductor package 900 is provided on the semiconductor chip 15. The first metal member 16 protrudes outside the semiconductor chip 15 only in one direction. The end portion of the first metal member 16 exists inside the semiconductor chip 15 in at least three directions. For example, in FIG. 2A, the first metal member 16 protrudes to the outside of the semiconductor chip 15 only in one direction that is the second direction.

In addition, a thickness (t4 in FIG. 2B) of the first metal member 16 of the semiconductor package 900 is larger than a thickness of the drain lead 11 (t3 in FIG. 2B). The thickness t4 of the first metal member 16 and the thickness t3 of the drain lead 11 are different from each other beyond the respective tolerance ranges. For example, the thickness t4 of the first metal member 16 is twice or more the thickness t3 of the drain lead 11.

In the case of the semiconductor package 900 according to Comparative Example, the asymmetry in the shape and thickness of the members in the semiconductor package 900 is large. For example, in view of the symmetry with respect to the center of gravity of the semiconductor chip 15, in the vertical direction, the thickness t4 of the first metal member 16 and the thickness t3 of the drain lead 11 are different from each other. In addition, in the horizontal direction, the end portion of the drain lead 11 is located outside both end portions of the semiconductor chip 15. On the other hand, the end portion of the first metal member 16 is located inside the one end portion of the semiconductor chip 15 and is located outside the other end portion.

As described above, in the semiconductor package 900, the asymmetry in the shape and thickness of the components with respect to the center of gravity of the semiconductor chip 15 exists both in the vertical and horizontal directions. The components have different thermal expansion coefficients. Therefore, the asymmetry in the shape and thickness of the components exists, so that the displacement of the components when the semiconductor package 900 is heated is increased. Accordingly, the stress generated in the semiconductor package 900 is increased.

In the semiconductor package 100 according to the first embodiment, the first metal member 16 protrudes to the outside of the semiconductor chip 15 in at least two directions. In addition, the thickness (t2 in FIG. 1B) of the first metal member 16 is substantially equal to the thickness (t1 in FIG. 1B) of the drain lead 11.

Therefore, in the semiconductor package 100, the symmetry in the shape and thickness of the components with respect to the center of gravity of the semiconductor chip 15 is increased both in the vertical and horizontal directions. The symmetry of the shape and thickness of the components is increased, so that the stress generated in the semiconductor package 100 when the semiconductor package 100 is heated is reduced.

As described above, according to the first embodiment, it is possible to realize a semiconductor package 100 capable of reducing stress.

Second Embodiment

A semiconductor device according to a second embodiment is different from that of the first embodiment in that the metal member has a groove provided on a surface of the metal member facing the semiconductor chip in a region protruding to the outside of the semiconductor chip. Hereinafter, redundant description of the same contents as those of the first embodiment will be omitted.

The semiconductor device according to the second embodiment is a semiconductor package 200 in which a semiconductor chip after a lead forming process is sealed with a mold resin.

Figure 3A:
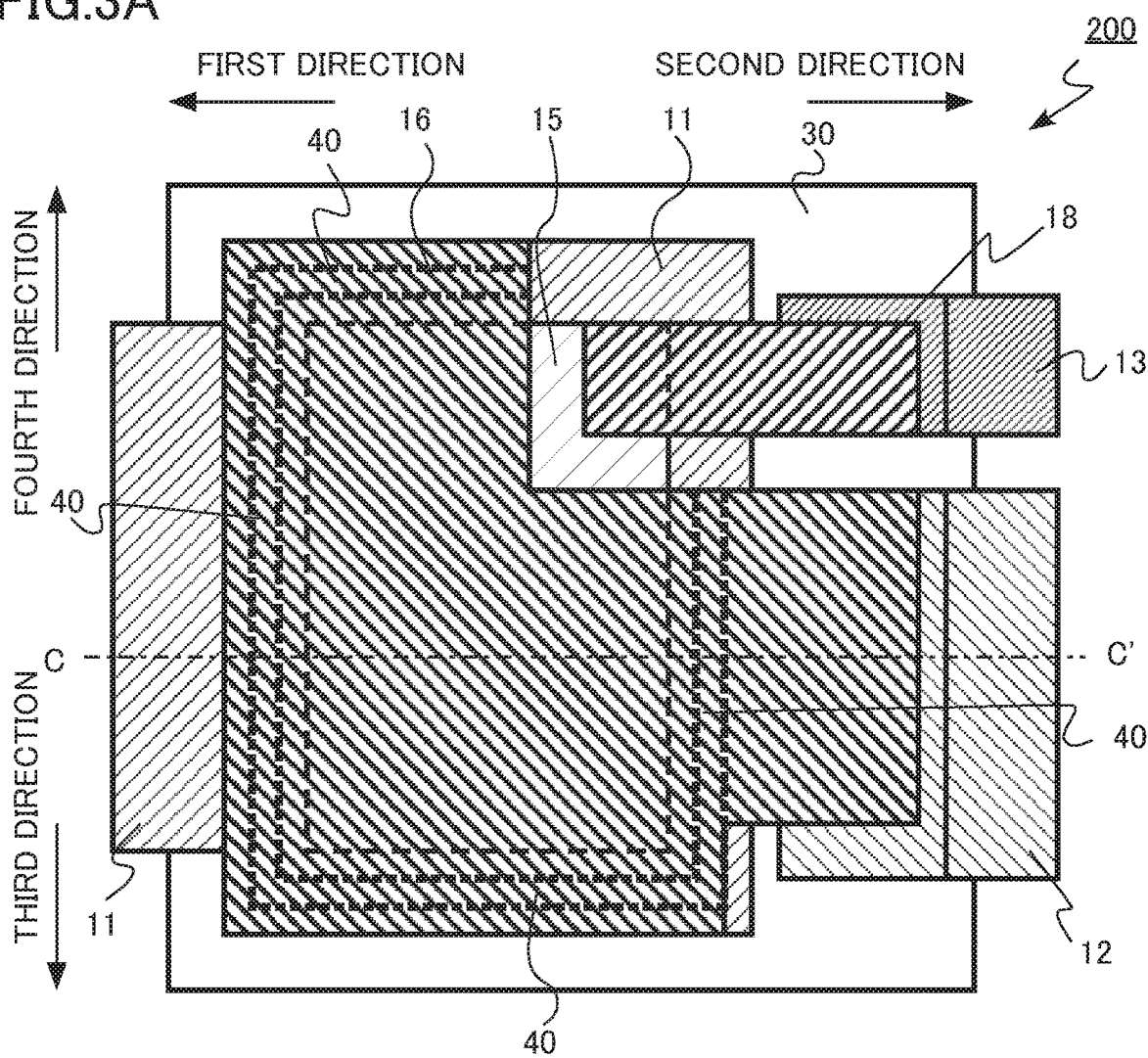
FIGS. 3A and 3B are schematic diagrams of a semiconductor device according to a second embodiment.
Figure 3B:
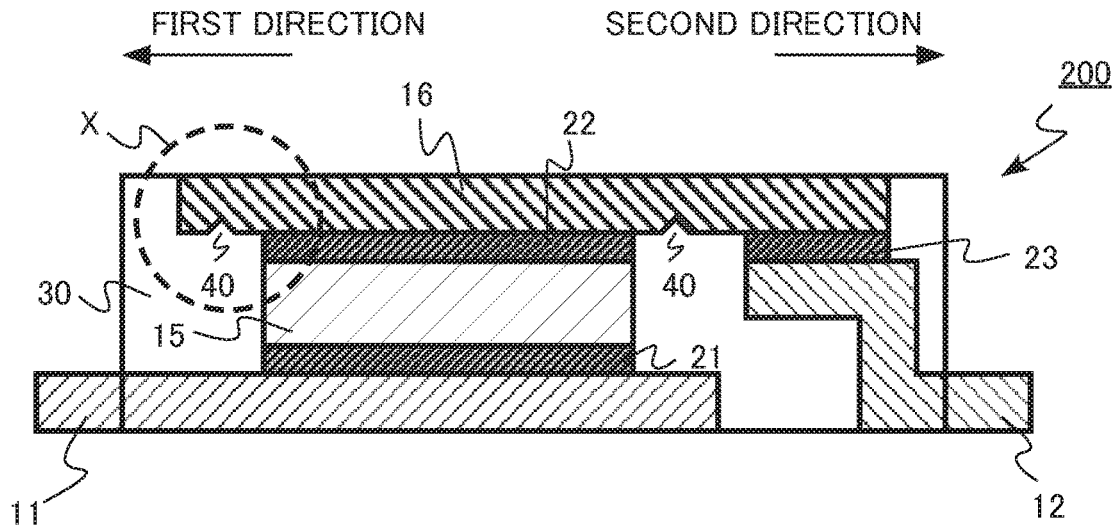

FIGS. 3A and 3B are schematic diagrams of the semiconductor device according to the second embodiment. FIG. 3A is a top diagram of the semiconductor package 200. FIG. 3A is a perspective diagram of the mold resin. FIG. 3B is a cross-sectional diagram of the semiconductor package 200. FIG. 3B is a cross-sectional diagram taken along line C-C' of FIG. 3A.

The semiconductor package 200 includes a drain lead 11 (first electrode terminal), a source lead 12 (second electrode terminal), a gate lead 13, a semiconductor chip 15, a first metal member 16 (metal member), a second metal member 18, a first bonding layer 21, a second bonding layer 22, a third bonding layer 23, and a mold resin 30.

The first metal member 16 includes a groove 40 provided in a region of the first metal member 16 protruding to the outside of the semiconductor chip 15. The groove 40 is provided outside the semiconductor chip 15 along the end portion of the semiconductor chip 15.

The groove 40 is provided on the surface of the first metal member 16 facing the semiconductor chip 15. The groove 40 is provided on the lower surface of the first metal member 16.

The position of the groove 40 on the lower surface of the first metal member 16 is represented by a dotted line in FIG. 3A. In FIG. 3A, the dotted line located inside the groove 40 indicates the position of the end portion of the semiconductor chip 15.

Figure 4:
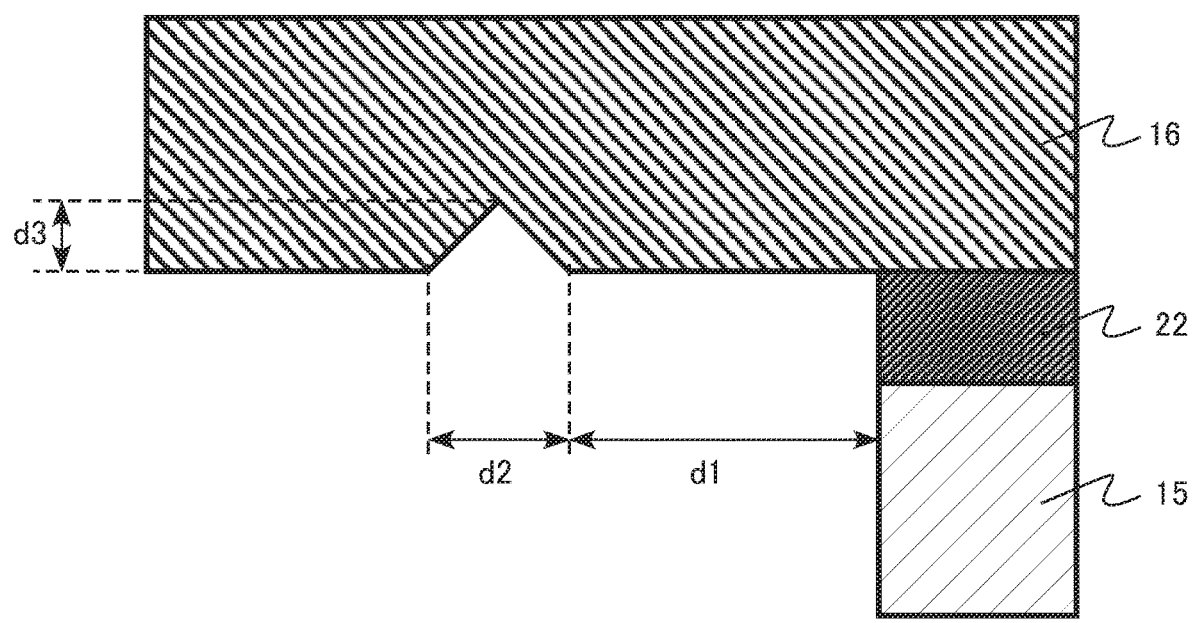
FIG. 4 is an enlarged schematic diagram of a portion of the semiconductor device according to the second embodiment.

FIG. 4 is an enlarged schematic diagram of a portion of the semiconductor device according to the second embodiment. FIG. 4 is an enlarged diagram of a region X in FIG. 3B.

The groove 40 is provided at a predetermined distance (d1 in FIG. 4) from the end portion of the semiconductor chip 15. The predetermined distance d1 is, for example, 0.01 mm or more and 0.3 mm or less.

The width (d2 in FIG. 4) of the groove 40 is, for example 0.01 mm or more and 0.1 mm or less. The depth (d3 in FIG. 4) of the groove 40 is, for example, 0.01 mm or more and 0.1 mm or less.

The shape of the groove 40 is, for example, a V shape or a U shape.

The grooves 40 may be provided continuously or intermittently.

In the case of bonding the first metal member 16 on the semiconductor chip 15 by using the second bonding layer 22, it is expected that the position of the first metal member 16 on the semiconductor chip 15 will not be stable. For example, in the case where the second bonding layer 22 is solder, since the solder is flowing until the solder is solidified, the first metal member 16 slides on the semiconductor chip 15, and thus, there is a concern that the first metal member 16 cannot be fixed at a desired position.

When the first metal member 16 cannot be fixed at a desired position, the symmetry of the shape and thickness of the components is deteriorated within the semiconductor package, and thus, there is a concern that the stress generated in the semiconductor package may be increased. In addition, in extreme cases, there is a concern that connection failure between the first metal member 16 and the source lead 12 may occur.

In the semiconductor package 200 according to the second embodiment, the first metal member 16 includes the groove 40. Therefore, when bonding the first metal member 16 on the semiconductor chip 15, the flow of the solder beyond the groove 40 is suppressed. Therefore, the position of the first metal member 16 on the semiconductor chip 15 is stabilized. Accordingly, the deterioration in symmetry of the shape and thickness of the components is suppressed, and the increase in stress occurring in the semiconductor package 200 is suppressed. In addition, problems such as connection failure are solved.

As described above, according to the second embodiment, it is possible to realize the semiconductor package 200 capable of being stabilized and reducing the stress.

In the first and second embodiments, the case where a MOSFET is used as a semiconductor chip has been described as an example, but the semiconductor chip is not limited thereto. For example, the semiconductor chip may be applied to other transistors and diodes such as an IGBT, a Shottky barrier diode (SBD), or a PIN diode as long as a semi conductor chip in which current flow between the upper and lower sides of the semiconductor chip.

In the first and second embodiments, the case where a portion of the first metal member 16 is exposed to the surface of the mold resin 30 has been described as an example, but the configuration where all of the first metal member 16 is covered with the mold resin 30 may be used.

While certain embodiments have been described, these embodiments have been presented by way of example only, and are not intended to limit the scope of the inventions. Indeed, a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device comprising:
   a first electrode terminal containing copper;
   a second electrode terminal containing copper;
   a semiconductor chip provided on the first electrode terminal, the semiconductor chip not protruding from an outer periphery of the first electrode terminal as viewed from above;

a metal member provided on the semiconductor chip, the metal member protruding to an outside of the semiconductor chip in at least three directions parallel to a surface of the first electrode terminal, the metal member electrically connected to the second electrode terminal, and the metal member containing copper;

a mold resin surrounding the semiconductor chip;

a first bonding layer provided between the first electrode terminal and the semiconductor chip;

a second bonding layer provided between the semiconductor chip and the metal member; and a third bonding layer provided between the second electrode terminal and the metal member, wherein the metal member has a groove provided on a surface of the metal member facing the semiconductor chip in a region protruding to the outside of the semiconductor chip, the groove has an inner edge and an outer edge, both the inner edge and the outer edge are located in the region protruding to the outside of the semiconductor chip, the semiconductor chip is surrounded by the groove, the groove is configured to suppress a flow of the second bonding layer beyond the groove when bonding the first metal member on the semiconductor chip.

2. The semiconductor device according to claim 1, wherein a thickness of the first electrode terminal is substantially equal to a thickness of the metal member.

3. The semiconductor device according to claim 1, wherein a portion of the metal member is exposed to a surface of the mold resin.

4. The semiconductor device according to claim 1, wherein a distance between the inner edge and the semiconductor chip is 0.01 mm or more and 0.3 mm or less.

5. The semiconductor device according to claim 1, wherein the metal member protruding to an outside of the semiconductor chip in four directions parallel to a surface of the first electrode terminal.

6. The semiconductor device according to claim 1, wherein the second bonding layer is a solder.

7. A semiconductor device comprising:

a first electrode terminal containing copper;

a second electrode terminal containing copper;

a semiconductor chip provided on the first electrode terminal, the semiconductor chip not protruding from an outer periphery of the first electrode terminal as viewed from above;

a metal member provided on the semiconductor chip, the metal member protruding to an outside of the semiconductor chip in at least two directions parallel to a surface of the first electrode terminal, the metal member electrically connected to the second electrode terminal, and the metal member containing copper;

a mold resin surrounding the semiconductor chip;

a first bonding layer provided between the first electrode terminal and the semiconductor chip;

a second bonding layer provided between the semiconductor chip and the metal member; and a third bonding layer provided between the second electrode terminal and the metal member, wherein the metal member has a groove provided on a surface of the metal member facing the semiconductor chip in a region protruding to the outside of the semiconductor chip, the groove has an inner edge and an outer edge, whole portions of the groove are located in the region protruding to the outside of the semiconductor chip.

8. The semiconductor device according to claim 7, wherein the metal member protruding to an outside of the semiconductor chip in at least three directions parallel to a surface of the first electrode terminal.

9. The semiconductor device according to claim 7, wherein the metal member protruding to an outside of the semiconductor chip in four directions parallel to a surface of the first electrode terminal.

* * * * *